United States Patent
Stainer (10) Patent No.: US 9,947,381 B2
(45) Date of Patent: Apr. 17, 2018

(54) SELF-REFERENCED MULTIBIT MRAM CELL HAVING A SYNTHETIC ANTIFERROMAGNETIC STORAGE LAYER

(71) Applicant: CROCUS Technology SA, Grenoble (FR)

(72) Inventor: Quentin Stainer, Montbonnot-St-Martin (FR)

(73) Assignee: CROCUS TECHNOLOGY SA, Grenoble (FR)

(*) Notice: Subject to any disclaimer, the term of this patent is extended or adjusted under 35 U.S.C. 154(b) by 0 days.

(21) Appl. No.: 15/318,715

(22) PCT Filed: May 28, 2015

(86) PCT No.: PCT/EP2015/061865
§ 371 (c)(1),
(2) Date: Dec. 14, 2016

(87) PCT Pub. No.: WO2015/193074
PCT Pub. Date: Dec. 23, 2015

(65) Prior Publication Data
US 2017/0110172 A1    Apr. 20, 2017

(30) Foreign Application Priority Data
Jun. 17, 2014  (EP) .................................... 14290174

(51) Int. Cl.
*G11C 11/16* (2006.01)
(52) U.S. Cl.
CPC ........ *G11C 11/161* (2013.01); *G11C 11/1673* (2013.01); *G11C 11/1675* (2013.01)

(58) Field of Classification Search
CPC .............. G11C 11/161; G11C 11/1675; G11C 11/1673
See application file for complete search history.

(56) References Cited

U.S. PATENT DOCUMENTS

| | | | | |
|---|---|---|---|---|
| 2011/0007560 A1* | 1/2011 | Dieny | .................... | B82Y 25/00 365/171 |
| 2011/0242883 A1* | 10/2011 | Zheng | .................... | G11C 11/15 365/158 |

(Continued)

FOREIGN PATENT DOCUMENTS

| | | |
|---|---|---|
| EP | 2575135 A1 | 4/2013 |
| EP | 2725580 A1 | 4/2014 |
| EP | 2741296 A1 | 6/2014 |

OTHER PUBLICATIONS

International Search Report for PCT/EP2015/061865 dated Jun. 24, 2015.
Written Opinion for PCT/EP2015/061865 dated Jun. 24, 2015.

*Primary Examiner* — Vanthu Nguyen
*Assistant Examiner* — Jerome Leboeuf
(74) *Attorney, Agent, or Firm* — Pearne & Gordon LLP (57) ABSTRACT

A multibit MRAM cell including a magnetic tunnel junction including a sense layer having a freely orientable sense magnetization; a tunnel barrier layer; and a synthetic antiferromagnet storage layer having a first and second storage layer. The sense magnetization induces a dipolar field having a magnitude above a spin-flop field of the storage layer. The MRAM cell also includes aligning means for aligning the sense magnetization in a plurality of distinct orientations such as to encode a plurality of distinct logic states in the MRAM cell. The present disclosure also concerns a method for operating the multibit MRAM cell.

15 Claims, 4 Drawing Sheets

(56) References Cited

U.S. PATENT DOCUMENTS

2012/0201074 A1    8/2012  Berger et al.
2015/0287450 A1*  10/2015  Prejbeanu ............. G11C 11/161
                                                          365/158
2015/0294708 A1*  10/2015  Annunziata ......... G11C 11/1675
                                                          365/158

* cited by examiner

SELF-REFERENCED MULTIBIT MRAM CELL HAVING A SYNTHETIC ANTIFERROMAGNETIC STORAGE LAYER

FIELD

The present disclosure concerns a self-referenced multibit MRAM cell comprising a synthetic antiferromagnetic storage layer that allows for good scalability and that can be operated using very low read and write field amplitudes. The present disclosure further concerns a method for operating the MRAM cell.

DESCRIPTION OF RELATED ART

MRAM devices have become the subject of increasing interest, in view of the discovery of magnetic tunnel junctions having a strong magnetoresistance at ambient temperatures. MRAM devices offer a number of benefits, such as faster speed of writing and reading, non-volatility, and insensitivity to ionizing radiations. Consequently, MRAM devices are increasingly replacing memory devices that are based on a charge state of a capacitor, such as dynamic random access memory devices and flash memory devices.

A multibit self-reference MRAM device typically comprises a storage layer having a storage magnetization direction, a sense layer having a sense magnetization direction, and a spacer layer disposed between the storage layer and the sense layer has been proposed in US2012201074 by the present applicant. During a write operation, the storage layer has a magnetization direction that is switchable between m directions to store data corresponding to one of m logic states, with m>2, and during a read operation, the sense layer has a magnetization direction that is varied, relative to the magnetization direction of the storage layer, to determine the data stored by the storage layer. Axial Induced Moment (AIM) rely on an angular reading operation where the minimum resistance angle is located by using a field of constant amplitude and variable angle.

In particular, during the write operation, a writing field is applied with a given angle. A storage magnetization of the storage layer being pinned by an antiferromagnetic layer is unpinned such that the storage magnetization can be aligned in accordance with the applied writing field. However, due to magnetostatic interactions between the sense layer and the storage layer, the writing field amplitude requirements increase exponentially as the size of the MRAM cell is decreased.

Using a synthetic antiferromagnet (SAF) storage layer allows reducing significantly the magnetostatic coupling of the storage layer with the sense layer, thus reducing the writing field amplitude. However, due to the reduced magnetic moment and larger anisotropy energy, the storage magnetization of a SAF storage layer is very difficult to align away from the magnetocrystalline easy axis of the storage layer.

EP2725580 discloses a method for writing and reading a plurality of data bits to a magnetic random access memory (MRAM) cell, the method comprising: heating the magnetic tunnel junction to the high temperature threshold; and applying a write magnetic field to orient the first and second storage magnetization; wherein said high temperature threshold comprises one of a first or third high temperature threshold such as to orient the first storage magnetization respectively antiparallel or parallel to the second storage magnetization); and a second high temperature threshold such as to orient the first storage magnetization with an angle below 180 DEG with respect to the second storage magnetization. EP2725580 teaches that the write magnetic field can produce a stray field what can aid switching of the magnetizations; however the solution thought in EP2725580 is insufficient to achieve an adequate reduction in writing field amplitude requirements.

SUMMARY

The present disclosure concerns a multibit MRAM cell comprising a magnetic tunnel junction including a sense layer having a freely orientable sense magnetization; a tunnel barrier layer between the sense layer and a SAF storage layer; the storage layer comprising a first storage layer having a first storage magnetization, a second storage layer having a second storage magnetization and storage coupling layer between the first and second storage layer; the first storage magnetization being pinned by an antiferromagnetic layer at a low threshold temperature of the magnetic tunnel junction and unpinned at a high threshold temperature of the magnetic tunnel junction; wherein the sense magnetization is arranged for inducing a dipolar field having a magnitude above a spin-flop field of the storage layer and capable of aligning the second storage magnetization when the magnetic tunnel junction is at the high threshold temperature; and wherein the MRAM cell further comprising aligning means for aligning the sense magnetization in a plurality of distinct orientations in the range of 0° to 360°, such that second storage magnetization can be aligned in said plurality of distinct orientations in accordance with the dipolar field, when the magnetic tunnel junction is at the high threshold temperature.

The present disclosure further concerns a method for operating the multibit MRAM cell, comprising, during a write operation:

heating the antiferromagnetic storage layer to the high threshold temperature such as to unpin the first storage magnetization;

aligning the sense magnetization in one of said plurality of distinct orientations such as to switch the first and second storage magnetization in the induced dipolar field in accordance with the direction of the sense magnetization; and cooling the antiferromagnetic storage layer to the low threshold temperature to freeze the first storage magnetization.

Advantages of the multibit MRAM cell disclosed herein comprise scalability of the MRAM cell at low patterning dimensions (equal or smaller than 65 nm). The multibit MRAM cell requires very low read and write field amplitudes obtainable, typically smaller than 50 Oe. The SAF storage layer can be written with orientations in the range of 0° to 360°, thus allowing a maximum multibit capacity (equal or larger than 3 bits per magnetic tunnel junction.

BRIEF DESCRIPTION OF THE DRAWINGS

The invention will be better understood with the aid of the description of an embodiment given by way of example and illustrated by the figures, in which:

FIGS. 2a and 2b show a top view of the magnetic tunnel junction where a first and second storage magnetizations are represented oriented in a dipolar field (FIG. 2a) and in the absence of the dipolar field, according to an embodiment;

DETAILED DESCRIPTION OF POSSIBLE EMBODIMENTS

Figure 1:
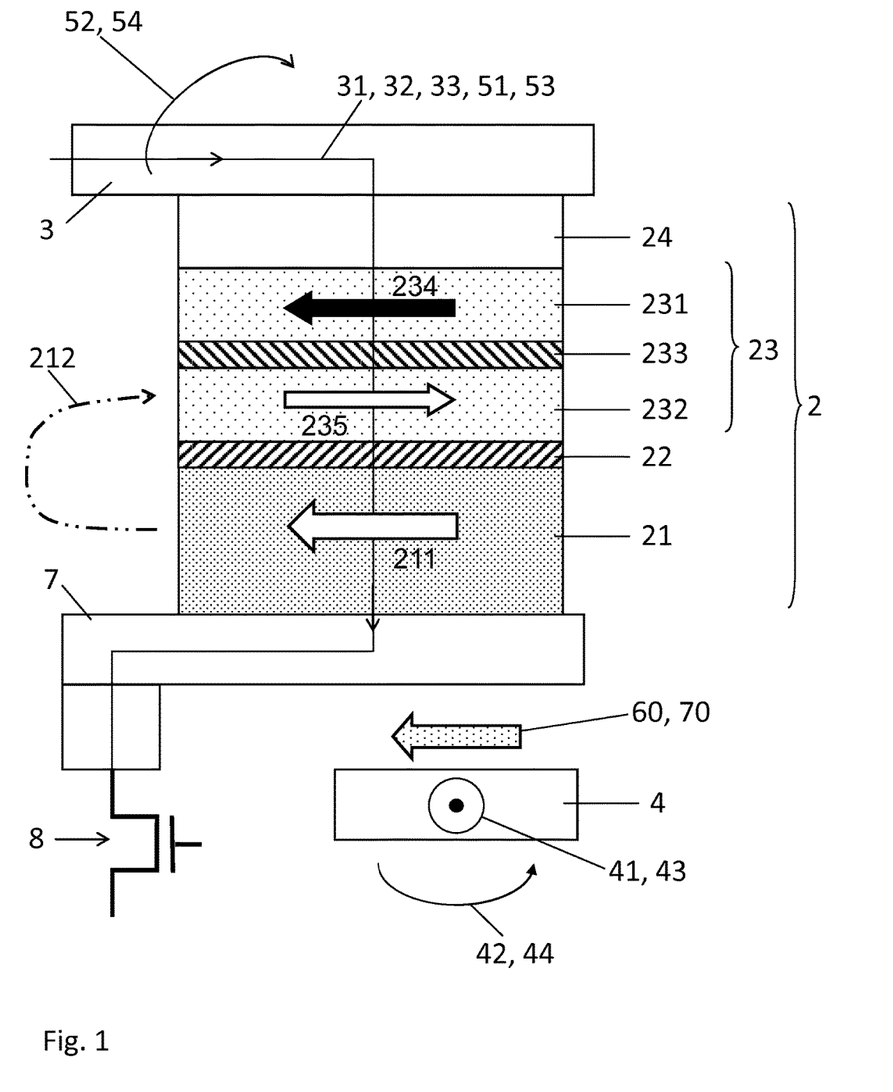
FIG. 1 shows a multibit MRAM cell 1 comprising a magnetic tunnel junction, according to an embodiment.

FIG. 1 shows a multibit MRAM cell 1 according to an embodiment. The MRAM cell 1 comprises a magnetic tunnel junction 2 including a sense layer 21 having a sense magnetization 211 that can be freely oriented, a storage layer 23, and a tunnel barrier layer 22 sandwiched between the storage layer 23 and the sense layer 21. The storage layer 23 comprises a synthetic storage layer, or synthetic antiferromagnet (SAF), comprising a first storage layer 231 having a first storage magnetization 234, and a second storage layer 232 having a second storage magnetization 235. A storage coupling layer 233 is included between the first and second storage layer 231, 232. The storage coupling layer 233 produces a magnetic coupling, namely a RKKY coupling, between the first and second storage layers 231, 232.

Referring to FIG. 1, the magnetic tunnel junction 2 also includes a storage antiferromagnetic layer 24, which is disposed adjacent to the first storage layer 231 and, through exchange bias, pins the first storage magnetization direction 234 along a particular one of the m directions when a temperature within, or in the vicinity of, the first antiferromagnetic layer 24 is at a low threshold temperature $T_L$, i.e., below a blocking temperature, such as a Neel temperature, or another threshold temperature of the antiferromagnetic layer 24. The storage antiferromagnetic layer 24 unpins, or frees, the first storage magnetization direction 234 when the temperature is at a high threshold temperature $T_H$, i.e., above the blocking temperature, thereby allowing the first storage magnetization direction 234 to be switched to another one of the m directions. Consequently, when the storage antiferromagnetic layer 24 is at the low threshold temperature $T_L$, the first storage magnetization 234 is pinned in the switched direction and the second storage magnetization 235 orients in a direction antiparallel to the switched direction of the first storage magnetization 234 due to the RKKY coupling of the storage coupling layer 233.

The storage antiferromagnetic layer 24 includes, or is formed of, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). For example, the storage antiferromagnetic layer 24 can include, or be formed of, an alloy based on Ir and Mn (or based on Fe and Mn) having a high threshold temperature $T_H$ in the range of about 120° C. to about 220° C., or about 150° C. to about 200° C. Because the sense magnetization 211 is unpinned, the high threshold temperatures $T_H$ can be selected to accommodate a desired application, such as a high temperature application, in the absence of, or without regard to, a threshold temperature that would otherwise set an upper bound of an operating temperature window. The sense magnetization 211 is freely adjustable at the low and high threshold temperatures $T_L$, $T_H$.

In an embodiment, the sense layer 21 is arranged such that a dipolar field 212 induced by the sense magnetization 211 has a magnitude that is above a spin-flop field $H_{SF}$ of the storage layer 23. When the antiferromagnetic storage layer 24 is at the high threshold temperature $T_H$, the dipolar field 212 is capable of aligning the first and second storage magnetization 235 in accordance with the direction of the dipolar field 212. In the particular case where the magnitude of the dipolar field 212 is above the spin-flop field $H_{SF}$ of the storage layer 23, the magnetic coupling between the first and second storage layers 231, 232 is such that each of the first and second storage magnetizations 234, 235 is oriented with a spin-flop angle $\theta_{SF}$ between a direction perpendicular to the dipolar field 212 and a direction of the dipolar field 212.

Each of the first and second storage layers 231, 232 includes, or is formed of, a magnetic material of the ferromagnetic type including iron ("Fe"), cobalt ("Co"), nickel ("Ni"), and their alloys, such as permalloy (or Ni80Fe20); alloys based on Ni, Fe, and boron ("B"); Co90Fe10; and alloys based on Co, Fe, and B.). The sense layer 21 can include the same ferromagnetic material than the first and second storage layers 231, 232, or different ferromagnetic materials. In general, suitable ferromagnetic materials include transition metals, rare earth elements, and their alloys, either with or without main group elements.

The storage coupling layer 233 can include, or be formed of, a non-magnetic material. Suitable non-magnetic materials include one of: ruthenium, chromium, rhenium, iridium, rhodium, silver, copper and yttrium. A thickness of the coupling layer 233 can be in the nm range, such as from about 0.4 nm to about 2 nm, or from about 0.6 nm to about 0.9 nm, or from about 1.6 nm to about 2 nm.

The sense layer 21 can include a soft ferromagnetic material, namely one having a relatively low coercivity, such as no greater than about 0.01 Oe, while the storage layers 231, 233 can include a hard ferromagnetic material, namely one having a relatively high coercivity, such as greater than about 0.01 Oe. In such manner, a magnetization of the sense layer 21 can be readily varied under low-intensity magnetic fields during read operations, while a magnetization of the storage layers 231, 233 remain stable.

The tunnel barrier layer 22 can include, or be formed of, an insulating material. Suitable insulating materials include oxides, such as aluminum oxide (e.g., $Al_2O_3$) and magnesium oxide (e.g., MgO). A thickness of the tunnel barrier layer 22 can be in the nm range, such as between about 1 nm and about 10 nm.

In particular, the sense layer 21 induces the dipolar field 212 having a magnitude above a spin-flop field $H_{SF}$ of the storage layer 23 in the case a thickness of the sense layer 21 is below about 10 nm, for example between about 1 nm and about 10 nm.

A thickness of each of the first and second storage layers 231, 232 should be of below about 10 nm. For example, a thickness of each of the first and second storage layers 231, 232 can be between about 0.1 nm and about 10 nm, between about 0.1 nm and about 5 nm, or between about 0.5 nm and about 4 nm.

The lateral dimension of the magnetic tunnel junction 2, and thus, the lateral dimension of the first and second storage layers 231, 232 and sense layer 21, should be smaller than 200 nm. In particular, the lateral dimension of the magnetic tunnel junction 2 can be between about 10 nm and about 200 nm, or between about 40 nm and about 100 nm. Here, the lateral dimension can correspond to the diameter of the magnetic tunnel junction 2.

The dipolar field 212 having a magnitude above a spin-flop field $H_{SF}$ of the storage layer 23 can have a magnitude between about 500 Oe and 1000 Oe.

In a preferred embodiment, the SAF storage layer 23 is highly compensated. In other words, the first and second storage layers 231, 232 are such that a local stray field induced by the first storage layer 231 is substantially equal to the one induced by the second storage layer 232. The highly compensated SAF storage layer 23 can be obtained, for example, by the adjusting a thickness of the first and second storage layer 231, 232.

The MRAM cell 1 is a multi-bit cell that stores a multi-bit data value. The implementation of such a multi-bit cell enhances a storage density of the MRAM cell 1, relative to an implementation with single-bit or binary cells. In accordance with the multi-bit implementation of the MRAM cell 1, each of the first storage magnetization 234 and the second storage magnetization 235 is switchable between m directions, corresponding to $m^2$ logic states, with m>2.

In an embodiment, a write operation of the MRAM cell 1 can comprise the steps of:

heating the antiferromagnetic storage layer 24 to the high threshold temperatures $T_H$, such that the first storage magnetization 234 is unpinned and can be freely switched;

aligning the sense magnetization 211 such as to induce a dipolar field 212 capable of switching the first and second storage magnetization 235 in accordance with the direction of the aligned sense magnetization 211; and cooling the antiferromagnetic storage layer 24 to the low threshold temperature $T_L$ to freeze the first storage magnetization 234.

In the embodiment illustrated in FIG. 1, the MRAM cell 1 includes a bit line 3 that is electrically coupled to the magnetic tunnel junction 2. Heating the antiferromagnetic storage layer 24 at the high threshold temperatures $T_H$ can thus be performed by passing a heating current 31 through the magnetic tunnel junction 2 via a bit line 3 (or by applying a voltage through the magnetic tunnel junction). The MRAM cell 1 can also include a selection transistor 8, which is electrically coupled through a strap 7 to the magnetic tunnel junction 2 (which is shown on the side of the sense layer 233), such that the heating current 31 is passed in the magnetic tunnel junction 2 by setting the selection transistor 8 in a saturated mode (or passing mode).

Aligning the sense magnetization 211 can be performed by applying a write magnetic field 60, simultaneously or after a short time delay applying the heating current 31. The write magnetic field 60 is applied such as to saturate the sense magnetization 211 in the direction of the write magnetic field 60. In other words, the sense magnetization 211 is coherently aligned with the write magnetic field 60.

When the antiferromagnetic storage layer 24 is at the high threshold temperatures $T_H$, the dipolar field 212 is capable of aligning the second storage magnetization 235 (adjacent to the sense layer 21) in accordance with the direction of the dipolar field 212. In the particular case where the magnitude of the dipolar field 212 is above the spin-flop field $H_{SF}$ of the storage layer 23, the magnetic coupling between the first and second storage layers 231, 232 is such that each of the first and second storage magnetizations 234, 235 is oriented with a spin-flop angle $\theta_{SF}$ between a direction perpendicular to the dipolar field 212 and a direction of the dipolar field 212.

Here, it is assumed that the second storage magnetization 235 is aligned by the write magnetic field 60 while the first unpinned storage magnetization 234 is aligned by the magnetic coupling effect of the coupling layer 233.

FIGS. 2a and 2b show a top view of the magnetic tunnel junction 2 where the sense magnetization 211 and the first and second storage magnetizations 234, 235 are schematically represented. In particular, FIG. 2a shows the first and second storage magnetizations 234, 235 being oriented in the dipolar field 212 when the antiferromagnetic storage layer 24 is at the high threshold temperatures $T_H$. Each of the first and second storage magnetizations 234, 235 makes a spin-flop angle $\theta_{SF}$ about the direction of the dipolar field 212. The spin-flop angle $\theta_{SF}$ is maximal when the magnitude of the dipolar field 212 corresponds to the spin-flop value $H_{SF}$, and diminishes when the magnitude of the dipolar field 212 exceeds the spin-flop value $H_{SF}$. The first and second storage magnetization 234, 235 become substantially parallel to the direction of the dipolar field 212 when the latter is applied at a saturation value $H_{SAT}$.

In the embodiment illustrated in FIG. 1, the MRAM cell 1 further includes a field line 4 that is magnetically coupled to the magnetic tunnel junction 2 and a bit line 3 that is electrically coupled to the magnetic tunnel junction 2. The field line 4 is adapted for passing a first write current 41 such as to induce a first write magnetic field 42 and the bit line 3 is adapted for passing a second write current 51 such as to induce a second write magnetic field 52. The write magnetic field 60 results from the combination of the first and second write magnetic field 42, 52. In FIG. 1, the field line 4 is represented substantially orthogonal to the bit line 3 but other configurations of the field line 4 and bit line 3 is also possible.

During the write operation, a first write current 41 is passed in the field line 4 such as to induce a first write magnetic field 42. A second write current 51 is passed in the bit line 3 (functioning as another field line) to induce a second write magnetic field 52. By varying the directions and magnitudes of the first and second write currents 41, 51, m distinct orientations of the write magnetic field 60 in the range of 0° to 360° are obtained. The sense magnetization 211 can thus be aligned in accordance with the write magnetic field 60 in m distinct orientations in the range of 0° to 360°.

By varying the direction of the write magnetic field 60, and thus the direction of the dipolar field 212 induced by the sense magnetization 211, the first storage magnetization 234 can be switched at m distinct orientations in the range of 0° to 360°, or m distinct values of a write angle $\theta_i$ of the first storage magnetization 234. Each value of the write angle $\theta_i$ can be assigned to a distinct encoded logic states.

The step of cooling can be performed by removing the heating source, i.e., the heating current 31 (or voltage) while maintaining the sense layer direction to allow the antiferromagnet to cool below its blocking temperature, thus pinning the SAF and ensuring retention of its magnetizations direction.

After cooling the antiferromagnetic storage layer 24 to the low threshold temperature $T_L$, the first storage magnetization 234 is frozen in the aligned direction, or write angle $\theta_i$. At the low threshold temperature $T_L$, the second storage magnetization 235 is switched in a direction antiparallel to the one of the first storage magnetization 234 by the magnetic coupling induced by the storage coupling layer 233 (see FIG. 2b). In the example of FIGS. 2a and 2b, the dipolar field 212 is shown applied in a direction along an axis 200.

After the write operation, the second storage magnetization 235 is thus also aligned in a direction making the write angle $\theta_i$ with the axis 200.

Figures 2, 3:
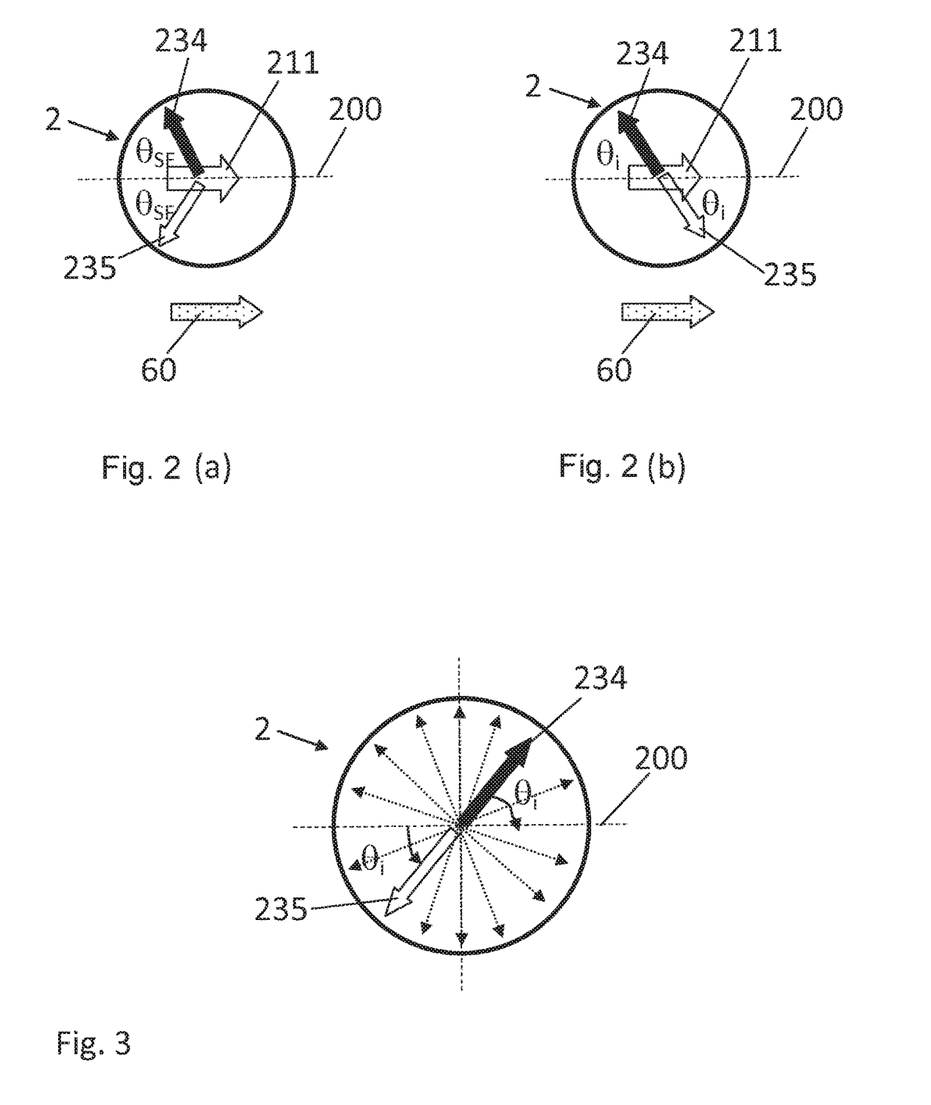
FIG. 3 shows a top view of the magnetic tunnel junction where the second storage magnetization direction is written, according to an embodiment.

FIG. 3 shows a top view of the magnetic tunnel junction 2 where the second storage magnetization direction 235 is written in a direction making a write angle $\theta_i$ with the axis 200. Also represented by the dotted arrows are possible orientations of the second storage magnetization direction 235 being switched from an initial one of m directions to another one of m other possible directions (corresponding to the write angle $\theta_i$ in the range of 0° to 360°. In accordance with the multi-bit implementation of the MRAM cell 1, the second storage magnetization 235 is switchable between m directions, corresponding to $m^2$ logic states, with m>2.

Figure 4:
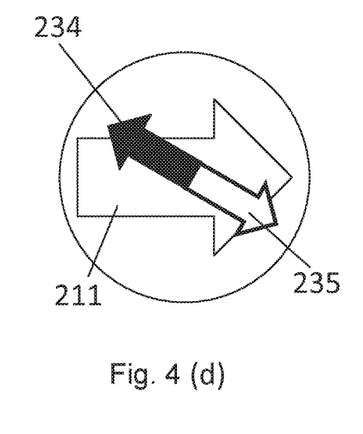
FIGS. 4a to 4d illustrate a top view of the magnetic tunnel junction during the write operation, according to an embodiment.
Figures 5A, 5B, 5C, 5D:
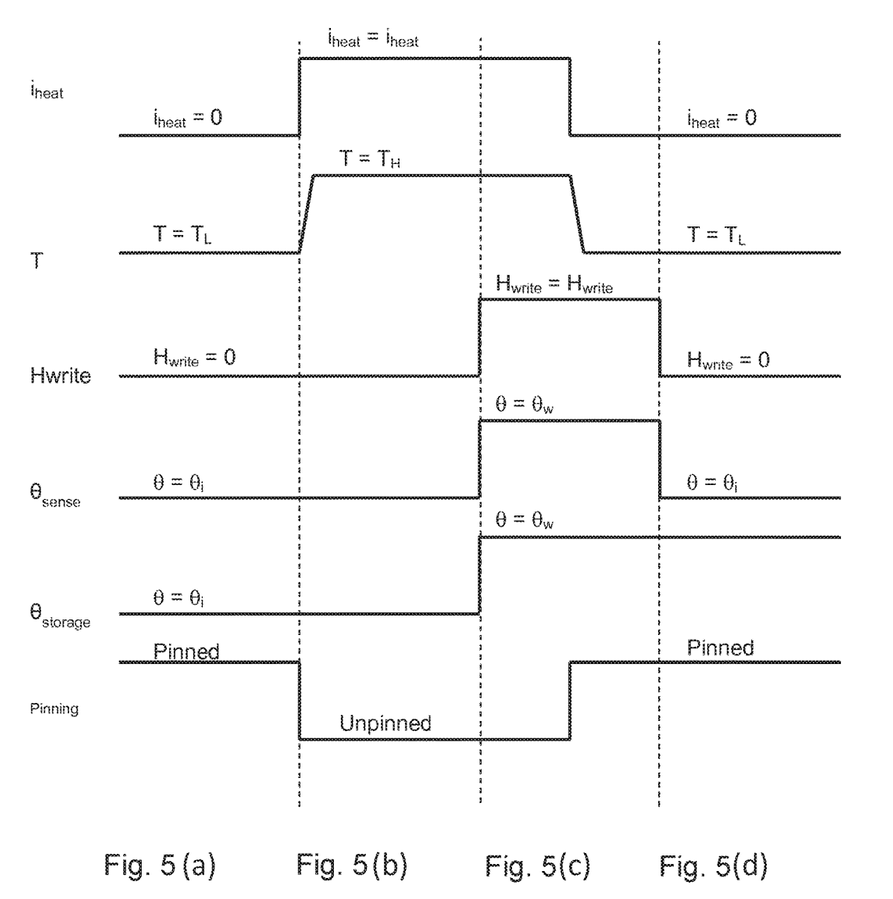
FIGS. 5a to 5d show a corresponding chronogram of the write operation.

FIGS. 4a to 4d illustrate a top view of the magnetic tunnel junction 2 during the write operation according to an embodiment and FIGS. 5a to 5d show a corresponding chronogram of the write operation. In particular, FIG. 5a shows the first and second storage magnetization 234, 235 prior to the write operation Prior to the write operation, no resultant write magnetic field 60 is applied ($H_{write}=0$ in FIG. 5a). The magnetic tunnel junction 2 is at the low threshold temperature $T_L$ and the first storage magnetization 234 is pinned in an initial one of m directions ($\theta=\theta_i$), the second storage magnetization 235 being oriented antiparallel to the first storage magnetization 234 due to the magnetic coupling of the coupling layer 233 (see FIG. 4a).

During the write operation, the antiferromagnetic storage layer 24 is heated to the high threshold temperatures $T_H$ by passing the heating current 31 ($i_{heat}$ in FIG. 5b), such that the first storage magnetization 234 is unpinned and is oriented in the dipolar field 212 generated by the sense layer 21 (see FIG. 4b). In particular, each of the first and second storage magnetization 234, 235 is oriented with a spin-flop angle $\theta_{SF}$ about a direction of the dipolar field 212 (along the axis 200).

The magnetic field 60 ($H_{write}$ FIG. 5c) is then applied to align the sense magnetization 211 in an aligned direction. The dipolar field 212 induced by the sense magnetization 211 switches the first and second storage magnetization 234, 235 to another one of m other possible directions ($\theta=\theta_w$ in FIG. 5c) in accordance with the aligned direction of the dipolar field 212. FIG. 4c shows each of the first and second storage magnetization 234, 235 making a spin-flop angle $\theta_{SF}$ with respect to the aligned direction of the dipolar field 212 (along the axis 200), when the magnitude of the dipolar field 212 is above the spin-flop field $H_{SF}$.

The antiferromagnetic storage layer 24 is then cooled to the low threshold temperature $T_L$ (FIG. 5d) to freeze the first storage magnetization 234 in the written orientation ($\theta=\theta_w$ in FIG. 5d). After cooling the antiferromagnetic storage layer 24 to the low threshold temperature $T_L$, the second storage magnetization 235 is switched in a direction antiparallel to the one of the first storage magnetization 234 by the magnetic coupling induced by the storage coupling layer 233. The write magnetic field 60 is removed and the sense magnetization 211, being unpinned, can return to its initial orientation.

According to an embodiment, during a read operation of the multibit MRAM cell 1, the bit line 3 (functioning as a field line) and the first field line 4 are activated to induce a set of read magnetic fields 44, 54 to vary a magnetization of the sense layer 21. Specifically, a first read current 43 can be applied through the first field line 4 to induce a first read magnetic field 44. A second read current 53 can also be applied through the bit line 3 to induce a second read magnetic field 54. The sense magnetization direction 211 is varied in accordance with a read magnetic field 70 corresponding to the combination of the first and second read magnetic fields 44, 54. Because the sense layer 21 is subject to little or no exchange bias, the sense magnetization direction 211 can be readily varied under low-intensity magnetic fields and at a temperature that is at the low threshold temperature $T_L$, while the first and second storage magnetization directions 232, 234 remain stable in their written direction.

According to an embodiment, the read operation of the MRAM cell 1 is carried out in multiple read cycles, in which the first and second read magnetic fields 44, 54 are induced, such that the sense magnetization direction 211 is aligned relative to the switched direction of the second storage magnetization 235 for each read cycle. Because the sense magnetization direction 211 can be aligned according to the read magnetic fields 70, the sense magnetization direction 211 can be successively switched between m directions according to each read cycle. In such manner, the sense magnetization direction is rotated to m distinct orientations according to the read operation scheme.

As part of each read cycle, a degree of alignment between the sense magnetization direction 211 and the second storage magnetization direction 235 is determined by applying a sense current 33 though the magnetic tunnel junction 2 via the bit line 3, with the selection transistor 8 in a saturated mode. Measuring a voltage across the magnetic tunnel junction 2 when the sense current 33 is applied yields a resistance value R of the magnetic tunnel junction 2 for a particular read cycle, and for a particular alignment of the sense magnetization 211 relative to the orientations of the second storage magnetization 235. Alternatively, a resistance value can be determined by applying a voltage across the magnetic tunnel junction 2 and measuring a current.

When the sense magnetization 211 is antiparallel to the second storage magnetization 235, a resistance value R of the magnetic tunnel junction 2 typically corresponds to a maximum value, namely Rmax, and, when the respective magnetizations are parallel, a resistance value of the magnetic tunnel junction 2 typically corresponds to a minimum value, namely Rmin. When the respective magnetizations are between antiparallel and parallel, a resistance value of the magnetic tunnel junction 2 is typically between Rmax and Rmin.

The read operation can further comprise the step of obtaining a resistance response of the magnetic tunnel junction 2 as a function of the sense magnetization direction 211 from the resistance values R measured during the multiple read cycles. The read operation can further comprise the step of extracting a second local derivative of the resistance response and determining a direction (write angle $\theta_w$) of the second storage magnetization 235 from the extracted second local derivative. This variant is described in patent application EP14290144 by the present applicant.

REFERENCE NUMBERS

1 MRAM cell
2 magnetic tunnel junction
200 axis
21 reference layer
211 sense magnetization
212 dipolar field
22 tunnel barrier layer
23 storage layer
231 first storage layer 232 second storage layer
233 storage coupling layer
234 first storage magnetization
235 second storage magnetization
24 antiferromagnetic storage layer
3 bit line
31 heating current
32 read current
4 field line
41 first write current
42 first write magnetic field
43 first read field current
44 first read magnetic field
51 second write current
52 second write magnetic field
53 second read field current
54 second read magnetic field
60 write magnetic field
7 strap
70 a read magnetic field
8 selection transistor
$\theta_i$ initial angle
$\theta_{SF}$ spin-flop angle
$\theta_w$ write angle
$H_{SF}$ spin-flop field
R junction resistance
$R_1$ first junction resistance
$R_2$ second junction resistance
$T_H$ high threshold temperature
$T_L$ low threshold temperature

What is claimed is:

1. A multibit MRAM cell comprising a magnetic tunnel junction including a sense layer having a freely orientable sense magnetization; a tunnel barrier layer between the sense layer and a storage layer; the storage layer comprising a first storage layer having a first storage magnetization, a second storage layer having a second storage magnetization and a storage coupling layer between the first and second storage layers; the first storage magnetization being pinned by an antiferromagnetic layer at a low threshold temperature of the magnetic tunnel junction and unpinned at a high threshold temperature of the magnetic tunnel junction;

the sense magnetization being arranged for inducing a dipolar field having a magnitude above a spin-flop field of the storage layer capable of aligning the second storage magnetization when the magnetic tunnel junction is at the high threshold temperature such that each of the first and second storage magnetization is oriented with a spin-flop angle $\theta_{SF}$ to the direction of the dipolar field;

the MRAM cell further comprising aligning means for aligning the sense magnetization in a plurality of distinct orientations in the range of 0° to 360°, wherein the first and second storage magnetizations move to maintain their orientation of spin-flop angle $\theta_{SF}$ to the direction of the dipolar field, during said aligning, such that the first and second storage magnetization can be aligned in said plurality of distinct orientations in the dipolar field, in accordance with the direction of the sense magnetization, when the magnetic tunnel junction is at the high threshold temperature.

2. The multibit MRAM cell according to claim 1, wherein the sense layer and the first and second storage layer has a thickness below 10 nm; and the magnetic tunnel junction 2 has a lateral dimension, perpendicular to said thickness, below 200 nm.

3. The multibit MRAM cell according to claim 2, wherein the sense layer has a thickness between 1 nm and 10 nm.

4. The multibit MRAM cell according to claim 2, wherein the first and second storage layer has a thickness between 1 nm and 10 nm; or between 0.1 nm and 5 nm, or preferably between 0.5 nm and 4 nm.

5. The multibit MRAM cell according to claim 2, wherein the magnetic tunnel junction has a lateral dimension, perpendicular to said thickness, between 10 nm and 200 nm, or preferably between 40 nm and 100 nm.

6. The multibit MRAM cell according to claim 1, wherein the first and second storage layers are such that a local stray field induced by the first storage layer is substantially equal to the one induced by the second storage layer.

7. The multibit MRAM cell according to claim 1, wherein said aligning means comprises a write magnetic field being orientable in m distinct orientations in the range of 0° to 360° and configured to saturate the sense magnetization in accordance with the direction of the write magnetic field.

8. The multibit MRAM cell according to any one of claim 7, wherein said aligning means comprises a field line magnetically coupled to the magnetic tunnel junction and adapted for passing a first write current inducing a first write magnetic field; and a bit line electrically coupled to the magnetic tunnel junction and adapted for passing a second write current inducing a second write magnetic field; the magnetic field resulting from the combination of the first and second write magnetic field.

9. A method for operating a multibit MRAM cell comprising a magnetic tunnel junction including a sense layer having a freely orientable sense magnetization; a tunnel barrier layer between the sense layer and a storage layer; the storage layer comprising a first storage layer having a first storage magnetization, a second storage layer having a second storage magnetization and a storage coupling layer between the first and second storage layers; the first storage magnetization being pinned by an antiferromagnetic layer at a low threshold temperature of the magnetic tunnel junction and unpinned at a high threshold temperature of the magnetic tunnel junction; the sense magnetization being arranged for inducing a dipolar field having a magnitude above a spin-flop field of the storage layer capable of aligning the second storage magnetization when the magnetic tunnel junction is at the high threshold temperature such that each of the first and second storage magnetization is oriented with a spin-flop angle $\theta_{SF}$ to the direction of the dipolar field; the MRAM cell further comprising aligning means for aligning the sense magnetization in a plurality of distinct orientations in the range of 0° to 360°, wherein the first and second storage magnetizations move to maintain their orientation of spin-flop angle $\theta_{SF}$ to the direction of the dipolar field, during said aligning, such that the first and second storage magnetization can be aligned in said plurality of distinct orientations in the dipolar field, in accordance with the direction of the sense magnetization, when the magnetic tunnel junction is at the high threshold temperature;

the method comprising, during a write operation:

heating the antiferromagnetic storage layer to the high threshold temperature such as to unpin the first storage magnetization;

orientating the first storage magnetization with the dipolar field such that each of the first and second storage magnetization is oriented with a spin-flop angle $\theta_{SF}$ to the direction of the dipolar field;

aligning the sense magnetization in one of said plurality of distinct orientations, and wherein the first and second storage magnetization move to maintain their orientation of spin-flop angle $\theta_{SF}$ to the direction of the dipolar field, during said aligning, such as to switch the first and second storage magnetization in the induced dipolar field in accordance with the direction of the sense magnetization;

cooling the antiferromagnetic storage layer to the low threshold temperature to freeze the first storage magnetization and to switch, by magnetic coupling, the second storage magnetization in a direction antiparallel to the one of the first storage magnetization.

10. The method according to claim 9, wherein said aligning the sense magnetization comprises applying a write magnetic field having a magnitude adapted for saturating the sense magnetization in a direction corresponding to the one of the write magnetic field.

11. The method according to claim 9,
wherein the multibit MRAM cell further comprises a field line magnetically coupled to the magnetic tunnel junction adapted for passing a first write current, and a bit line electrically coupled to the magnetic tunnel junction and adapted for passing a second write current; the method further comprising:

passing the first write current in the field line to induce a first write magnetic field and passing the second write current in the bit line to induce the second write magnetic field;

adjusting the direction and magnitude of each of the first and second write current such that the write magnetic field is oriented in one of said plurality of distinct orientations.

12. The method according to claim 9, further comprising, during a read operation:

performing a plurality of read cycles, wherein each read cycle comprises aligning the sense magnetization direction relative to the switched direction of the second storage magnetization, and measuring a resistance of the magnetic tunnel junction being indicative of a degree of alignment between the sense magnetization direction and the second storage magnetization direction.

13. The multibit MRAM cell according to claim 2, wherein the first and, second storage layer has a thickness between 0.1 nm and 5 nm.

14. The multibit MRAM cell according to claim 2, wherein the first and second storage layer has a thickness between 0.5 nm and 4 nm.

15. The multibit MRAM cell according to claim 2, wherein the magnetic tunnel junction has a lateral dimension, perpendicular to said thickness, between 40 nm and 100 mm.

* * * * *